United States Patent

Kambara

[11] Patent Number: 6,128,199
[45] Date of Patent: Oct. 3, 2000

[54] COMPOSITE DEVICE AND MANUFACTURING METHOD THEREOF

[75] Inventor: Shigeru Kambara, Kyoto, Japan

[73] Assignee: Rohm Co., Ltd., Kyoto, Japan

[21] Appl. No.: 09/039,385

[22] Filed: Mar. 16, 1998

[30] Foreign Application Priority Data

Mar. 19, 1997 [JP] Japan ................................ 9-065930

[51] Int. Cl.⁷ .................................................. H05K 3/30
[52] U.S. Cl. ........................ 361/760; 361/765; 361/766; 361/313; 361/321.1; 361/308.1; 338/308; 338/309; 219/121.68; 219/121.69; 29/620
[58] Field of Search ................................ 361/760, 765, 361/766, 313, 321.1, 308.1, 320; 338/308, 309, 314, 302, 330; 333/172; 219/121.68, 121.69, 121.85; 29/25.41, 25.42, 620, 621

[56] References Cited

U.S. PATENT DOCUMENTS

| 4,320,165 | 3/1982 | Cash ................................ 428/213 |
| 4,503,418 | 3/1985 | Belopolsky ............................ 338/309 |
| 5,510,594 | 4/1996 | Mori et al. .......................... 219/121.69 |
| 5,691,877 | 11/1997 | Hanamura et al. ...................... 361/313 |
| 5,699,224 | 12/1997 | Hanamura et al. ...................... 361/313 |
| 5,838,070 | 11/1998 | Naruse et al. ......................... 257/779 |
| 5,898,563 | 4/1999 | Hanamura .............................. 361/313 |

FOREIGN PATENT DOCUMENTS

| 56-35500 | 4/1981 | Japan . |
| 62-150874 | 9/1987 | Japan . |
| 07057972 | 8/1993 | Japan ................................. 361/760 |
| 5-275959 | 10/1993 | Japan . |
| 7-57972 | 3/1995 | Japan . |
| 7-320915 | 12/1995 | Japan . |

*Primary Examiner*—Leo P. Picard
*Assistant Examiner*—David Foster
*Attorney, Agent, or Firm*—Arent, Fox, Kintner, Plotkin & Kahn

[57] ABSTRACT

A resistance element, a capacitor and an intermediate electrode are formed on a substrate. The capacitor and the resistance element are connected with the intermediate electrode interposed. Two terminal electrode portions are connected to each other through the intermediate electrode.

8 Claims, 6 Drawing Sheets

COMPOSITE DEVICE AND MANUFACTURING METHOD THEREOF

BACKGROUND OF THE INVENTION

1. Field of the Invention

The present invention generally relates to a composite device. More specifically, the present invention relates to a composite device having a thick film type capacitor and a thick film type resistor formed on a chip type insulating substrate, and adapted to enable solder mounting on a printed board or the like. The present invention also relates to the method of manufacturing such a composite device.

2. Description of the Background Art

In a conventional composite device, terminal electrode portions for connection are formed on left and right end portions of a chip type insulating substrate. On an upper surface of the insulating substrate, a thick film type capacitor and a thick film type resistor are formed. One electrode of the capacitor is connected to one end of the resistor. The other electrode of the capacitor is connected to one of the terminal electrode portions mentioned above. The other end of the resistor is connected to the other one of the terminal electrode portions. The terminal electrode portions provided on the left and right end portions of the insulating substrate are soldered to a printed board.

The conventional composite device structured as described above suffers from the following problems.

As already described, in the conventional composite device, a capacitor and a resistor are connected in series to each other on one chip type insulating substrate. Therefore, application thereof is limited to serial connection of the capacitor and the resistor in one interconnected circuitry. As a result, when a capacitor and a resistor are to be provided parallel to each other in one interconnected circuitry, or when either one of the capacitor and the resistor is to be provided in one interconnected circuitry, the composite device cannot be used. This makes the range of application of the conventional composite device very narrow.

Therefore, when a parallel circuitry including a capacitor C and a resistor R is to be formed as shown in FIG. 11, a chip type capacitor and a chip type resistor have to be mounted separately on a printed board. When a filter circuit is to be formed by a capacitor C and a resistor R as shown in FIG. 12 or 13, a chip type capacitor and a chip type resistor have to be mounted separately on a printed board. Therefore, the cost necessary for mounting is significantly increased, mounting density on the printed board is lower and eventually, the size of the printed board is made large.

SUMMARY OF THE INVENTION

Therefore, an object of the present invention is to provide a composite device improved to allow for wider range of applications.

Another object of the present invention is to provide a composite device improved to increase density of mounting on a printed board.

A still further object of the present invention is to provide a composite device improved to significantly reduced cost for mounting on a printed board.

A still further object of the present invention is to provide a composite device improved to allow reduction in size and weight of a printed board.

A still further object of the present invention is to provide a manufacturing method enabling manufacturing of a number of such composite devices from one ceramic plate as a raw material.

The above described objects of the present invention can be attained by the composite device including a substrate having first, second, third and fourth end surfaces, wherein the first and second end surfaces oppose to each other and the third and fourth end surfaces oppose to each other. A first end electrode is provided on the substrate near the first end surface. A second end electrode is provided on the substrate near the second end surface. An intermediate electrode is provided on the substrate between the first and second end electrodes. A thick film type capacitor is provided on the substrate between the first end electrode and the intermediate electrode. A thick film type resistance element is provided on the substrate between the second end electrode and the intermediate electrode. A first terminal electrode portion is provided on the first end surface to be electrically connected to the first end electrode. A second terminal electrode portion is provided on the second end surface to be electrically connected to the second end electrode. A third terminal electrode portion is provided on the third end surface to be electrically connected to the intermediate electrode. The thick film type capacitor includes a lower electrode film provided on the substrate and having one end connected to the intermediate electrode, and an upper electrode film provided on the lower electrode film with a dielectric film interposed, having one end electrically connected to the first end electrode.

According to the present invention, a capacitor and a resistance element are connected in series between the first and second terminal electrode portions. The capacitor and the resistance element are connected to the third terminal electrode portion. Therefore, when mounted on a printed board, by appropriately selecting and disconnecting a mid portion of an interconnected circuitry and by connecting resulting end portions of the disconnected portion to the first terminal electrode portion and the second terminal electrode portion respectively, it becomes possible to connect the capacitor and the resistor in series. By appropriately selecting and disconnecting a mid portion of an interconnected circuitry and connecting the resulting one end to the first and second terminal electrode portions and the other end to the third terminal electrode portion, it is possible to connect the capacitor and the resistor parallel to each other. Further, by appropriately selecting and disconnecting a mid portion of an interconnection circuitry, connecting one of the resulting end to the first or second terminal electrode portion and connecting the other end to the third terminal electrode portion, it is possible to form either a capacitor or a resistor in the interconnected circuitry. Further, the present invention is applicable when one interconnected circuitry is to be connected in T shape to another interconnected circuitry. In that case, the first terminal electrode portion is connected to one end of one interconnected circuitry, the second terminal electrode portion is connected to the other end of this one interconnected circuitry, and the third terminal electrode portion is connected to another interconnected circuitry.

According to the present invention, applications of a surface mounting type composite device including a capacitor and a resistance element can be made wider. More specifically, applications other than provision of the capacitor and the resistor connected in series in one interconnected circuitry are possible. Further, the parallel circuit such as shown in FIG. 11 as well as the CR filter circuit such as shown in FIGS. 12 and 13 may be provided by only one component. Therefore, the cost for mounting on a printed board can significantly be reduced. Further, mounting density on the printed board is increased, enabling reduction in size and weight of the printed board.

Further, by providing the third terminal electrode portion on each of the third and fourth end surfaces of the insulating substrate, it is possible to provide a jumper component such as disclosed in Japanese Patent Laying-Open No. 56-35500 and Japanese Utility Model Laying-Open No. 62-150874. This further increases possible applications.

In the method of manufacturing composite devices in accordance with another aspect of the present invention, a ceramic plate sectioned such that a plurality of substrates each having first, second, third and fourth end surfaces wherein the first and second end surfaces oppose to each other and the third and fourth end surfaces oppose to each other and wherein through holes each exposing part of the third and fourth end surfaces are formed in the ceramic plate is prepared. A third terminal electrode portion is formed on an inner surface of the through hole. On the ceramic substrate, a first end electrode is formed near the first end surface, a second end electrode is formed near the second end surface, and an intermediate electrode electrically connected to the third terminal electrode portion is formed between the first and second end electrodes. A thick film type capacitor is formed on the ceramic plate between the first end electrode and the intermediate electrode. A thick film type resistance element is formed on the ceramic plate between the second end electrode and the intermediate electrode. The ceramic plate is cut and divided such that the first and second end surfaces are exposed. A first terminal electrode electrically connected to the first end electrode is formed on the first end surface, and a second terminal electrode portion electrically connected to the second end electrode is formed on the second end surface. The divided ceramic plate is further cut and divided so that the third and fourth end surfaces are exposed.

According to this method, a plurality of composite devices each having the above described structure can be manufactured simultaneously at a low cost from one ceramic plate as a row material.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

Figure 1:
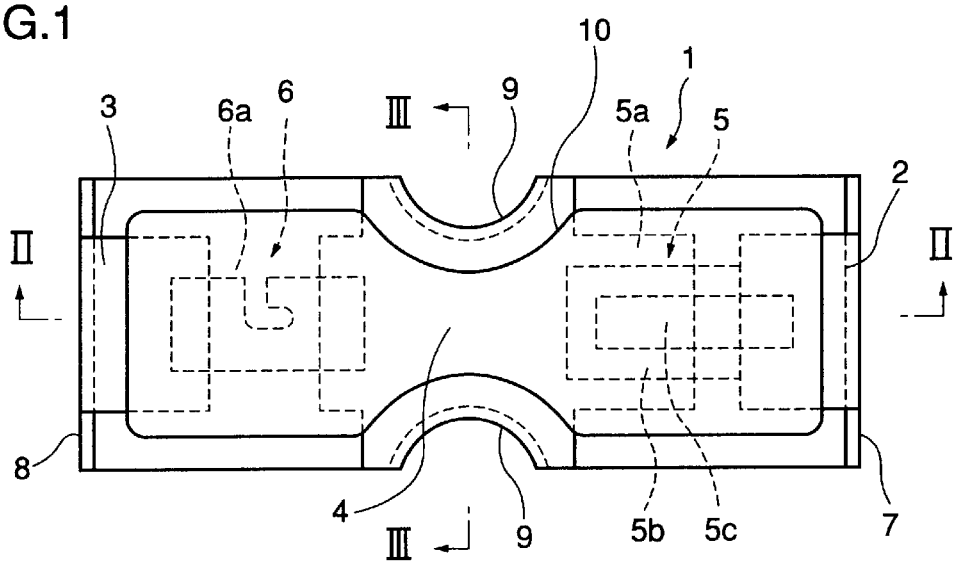
FIG. 1 is a plan view of a composite device showing an embodiment of the present invention.
Figure 2:
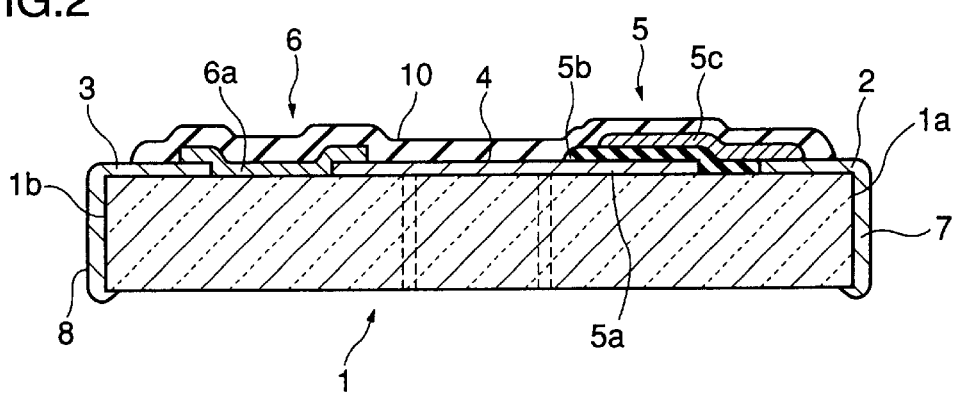
FIG. 2 is a cross section taken along the line II—II of FIG. 1.
Figure 3:
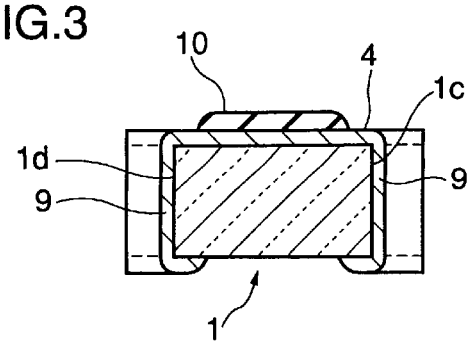
FIG. 3 is a cross section taken along the line III—III of FIG. 1.

Referring to FIGS. 1, 2 and 3, the composite device in accordance with the present invention includes an insulating substrate 1 formed of ceramics or the like and configured as a rectangular chip. On insulating substrate 1, end electrodes 2 and 3 are formed. End electrodes 2 and 3 are formed on left and right end portions of insulating substrate 1 in the figure. An intermediate electrode 4 is formed between end electrodes 2 and 3. A lower electrode film 5a extends from an end portion of intermediate electrode 4. Intermediate electrode 4 and lower electrode film 5a are formed integrally. Since intermediate electrode 4 is integrated with lower electrode film 5a, end electrodes 2, 3, intermediate electrode 4 and lower electrode film 5a can be prepared from the same material and at the same time. It is preferred that plating-stable and solder-stable material is used as the material, because intermediate electrode 4 and lower electrode film 5a are treated with plating and solder. Lower electrode film 5a is covered with a dielectric film 5b. An upper electrode film 5c is formed on lower electrode film 5a with dielectric film 5b interposed. Upper electrode film 5c is electrically connected to end electrode 2. Lower electrode film 5a, dielectric film 5b and upper electrode film 5c constitute a thick film type capacitor 5. A thick film type resistor 6 is provided on insulating substrate 1. Resistor 6 is formed of a resistive film 6a. Resistive film 6a is provided between end electrode 3 and intermediate electrode 4. On an end surface 1a of insulating substrate 1, a first terminal electrode portion 7 electrically connected to end electrode 2 is provided. On the other end surface 1b of insulating substrate 1, a second terminal electrode portion 8 electrically connected to end electrode 3 is provided. Between the third end surface 1c and the fourth end surface 1d of insulating substrate 1, third terminal electrode portions 9, 9 electrically connected to intermediate electrode 4 are formed, respectively.

Capacitor 5 and resistor 6 are entirely covered by a cover coat 10 formed of glass or a synthetic resin. Cover coat 10 may cover only the portions of the substrate having capacitor 5 and resistor 6. Cover coat 10 may have a single-layered structure or two or three layered structure.

Figure 4:
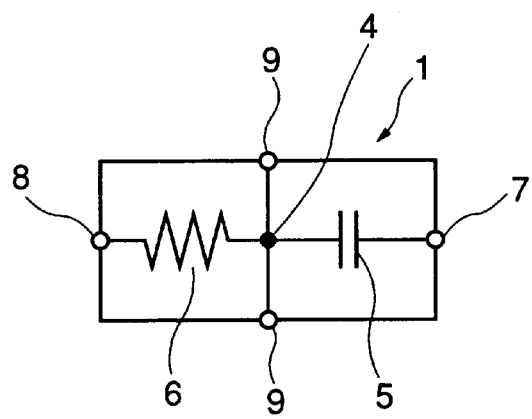
FIG. 4 is an equivalent circuit diagram of a composite element in accordance with an embodiment of the present invention.

FIG. 4 is an equivalent circuit diagram of the composite device shown in FIGS. 1 to 3. Between the first and second terminal electrode portions 7 and 8, capacitor 5 and resistor 6 are connected in series, with intermediate electrode 4 interposed. Two third terminal electrode portions 9, 9 are connected to each other by intermediate electrode 4.

Mounting of the composite device in accordance with the present embodiment on a printed board will be described.

A mid portion of one interconnected circuitry is appropriately selected and disconnected, and resulting disconnected portions are connected to the first and second terminal electrode portions 8, respectively, then a structure in which capacitor 5 and resistor 6 are connected in series is provided in one interconnected circuitry. By appropriately selecting and disconnecting a portion in one interconnected circuitry, connecting one end of the disconnected point to the first and second terminal electrode portions 7 and 8, and connecting the other end to one of the third terminal electrode portions 9, a structure including parallel connection of capacitor 5 and resistor 6 is provided in one interconnected circuitry. Further, by appropriately selecting and disconnecting a portion in one interconnected circuitry, connecting one end of the disconnected portion to the first or second terminal electrode portion 7 or 8, and connecting the other end to one of the third terminal electrode portions 9, a structure including capacitor 5 or resistor 6 in one interconnected circuitry is provided. Further, when an interconnected circuitry is to be connected in T shape to another interconnected circuitry, the first and second terminal electrode portions 7 and 8 should be connected to one and the other ends of the aforementioned another interconnected circuitry, and one of the third terminal electrode portions 9, 9 should be connected to said one interconnected circuitry.

By using both of the third terminal electrode portions 9, 9, it is also possible to provide a jumper component providing power over the aforementioned one interconnection circuit, such as disclosed in Japanese Patent Laying-Open No. 56-35500 and Japanese Utility Model Laying-open No. 62-150874.

The method of manufacturing the composite device shown in FIGS. 1 to 3 will be described in the following.

Figure 5:
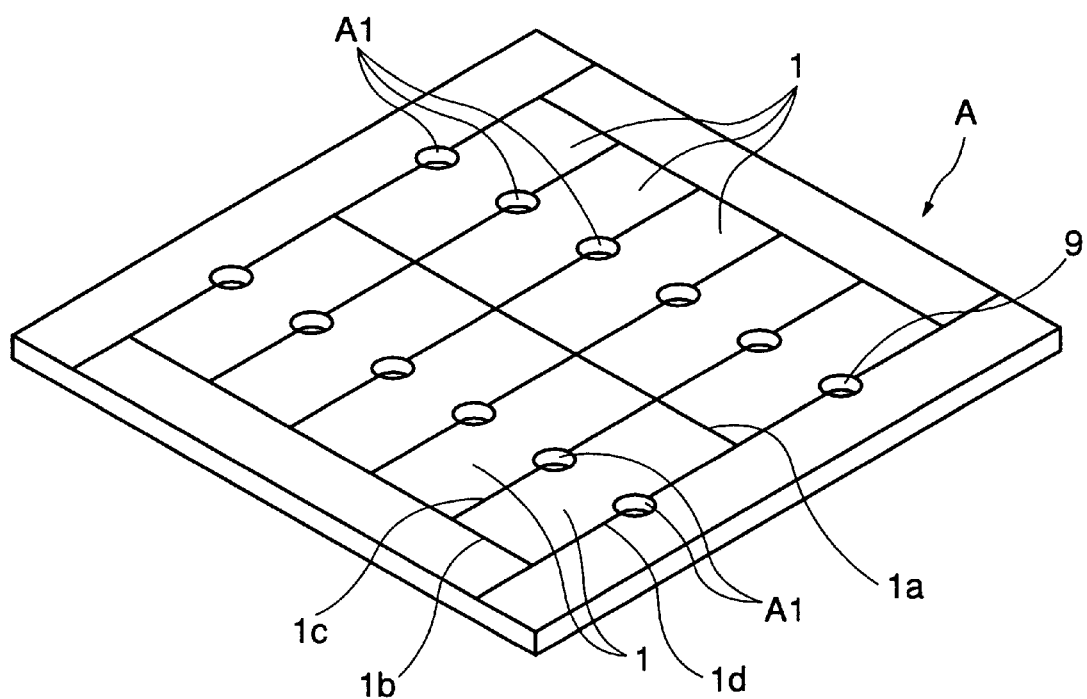
FIGS. 5 to 10 are perspective views showing a ceramic plate in the first to sixth steps of manufacturing the composite device in accordance with the present invention.

Referring to FIG. 5, a ceramic plate A sectioned to provide a plurality of insulating substrate 1 each having first, second, third and fourth end surfaces 1a, 1b, c and 1d, with the first and second end surfaces 1a and 1b opposing to each other and the third and fourth end surfaces 1c and 1d opposing to each other, wherein through holes A1 each exposing parts of the third and fourth end surfaces 1c and 1d are formed, is prepared. Here, a plurality of insulating substrates 1 are connected integrally, and therefore the first to fourth end surfaces are not visible. However, for convenience, description is given assuming presence of the first, second, third and fourth end surfaces.

Figure 6:
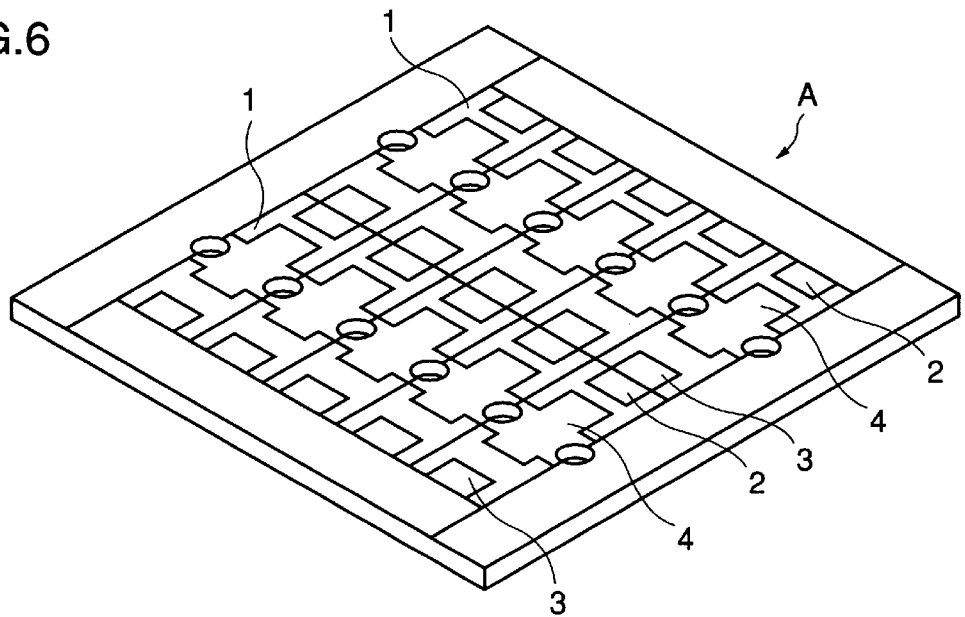

Referring to FIGS. 1 (finished product) and 5, the third terminal electrode portion 9 is formed on an inner surface of each through hole A1. Referring to FIGS. 1 and 6, end electrodes 2 and 3 are formed at prescribed positions on an upper surface of ceramic plate A. Simultaneously with formation of end electrodes 2 and 3, an intermediate electrode 4 having a lower electrode film 5a integrally connected thereto is formed.

Figure 7:
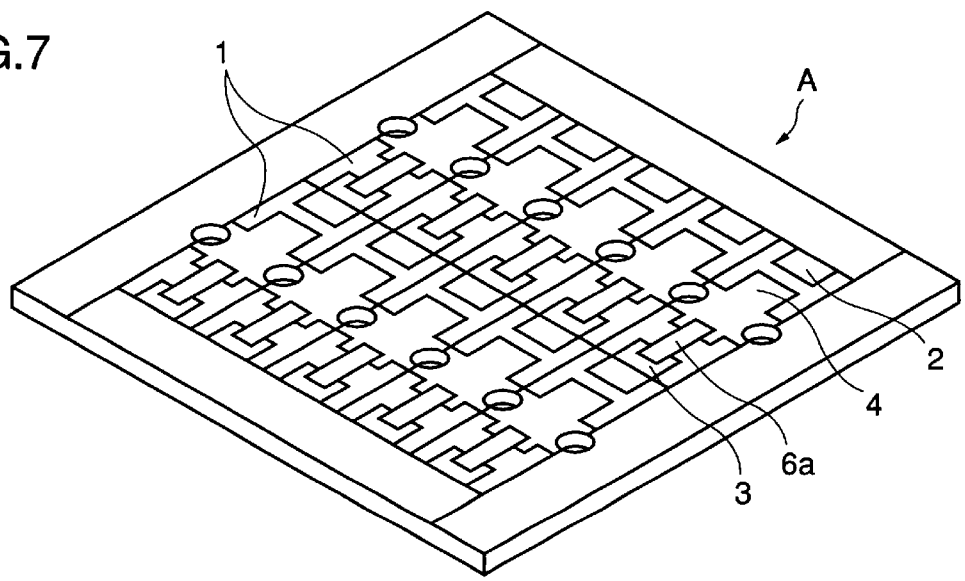

Referring to FIGS. 1 and 7, a resistive film 6a is formed at a prescribed position on ceramic plate A. Resistive film 6A is subjected to trimming adjustment so that resistance value of resistive film 6a is within a prescribed tolerable range. In this manner, resistor 6 is completed.

Figure 8:
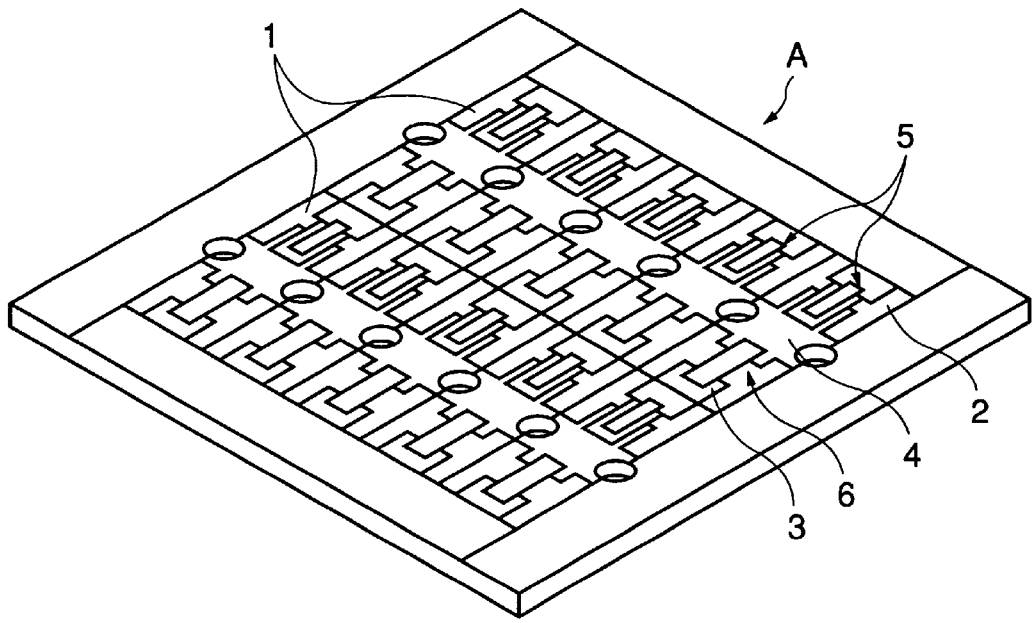

Referring to FIGS. 1 and 8, a dielectric film 5b is formed at a prescribed position on ceramic plate A. An upper electrode film 5c is formed on dielectric film 5b. In this manner, capacitor 5 is completed.

Figure 9:
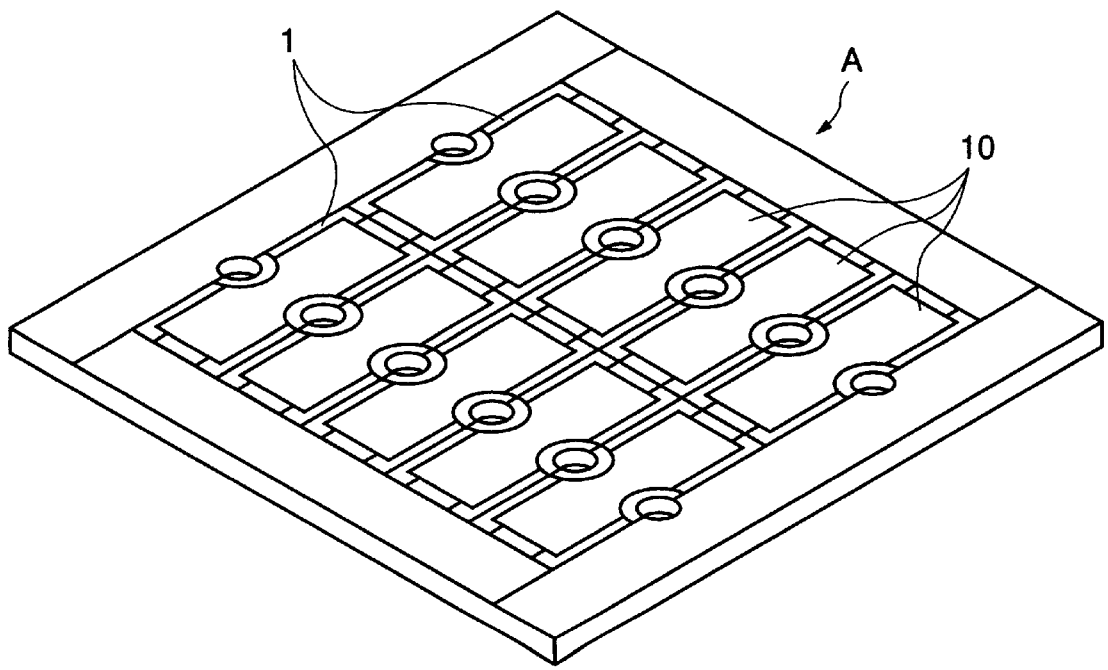
Figure 10:
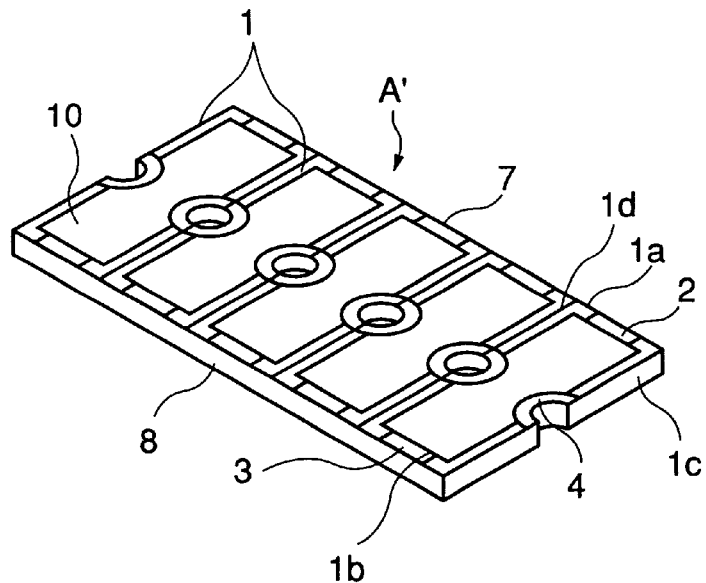
Figure 11:
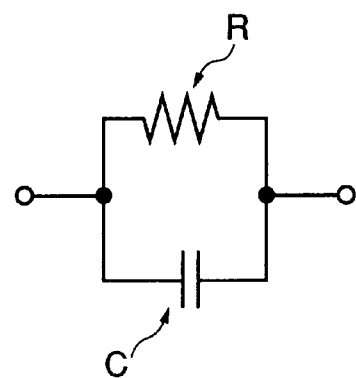
FIG. 11 shows a parallel circuit including a capacitor and a resistor.
Figure 12:
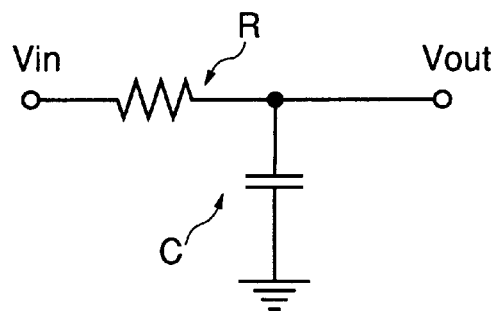
FIG. 12 shows a CR filter circuit including a capacitor and a resistor.
Figure 13:
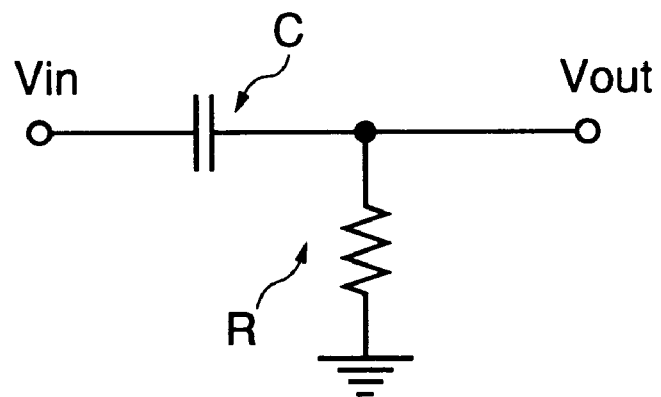
FIG. 13 shows a CR filter circuit including a capacitor and a resistor.

Referring to FIGS. 1 and 9, a cover coat 10 is formed at a prescribed position on an upper surface of ceramic plate A. Referring to FIGS. 9 and 10, ceramic plate A is cut and divided such that the first and second end surfaces 1a and 1b of insulating substrate 1 are exposed, thus forming bar-shaped ceramic plates A'. First terminal electrode portion 7 is formed on first end surface 1a and the second terminal electrode portion 8 is formed on the second end surface 1a.

Though not shown, each bar-shaped ceramic plate A' is cut and divided such that the third and fourth end surfaces 1c and 1d are exposed. In this manner, a plurality of composite devices shown in FIGS. 1 to 3 can be formed simultaneously from one ceramic plate A as a raw material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite device, comprising:
    a substrate having first, second, third and fourth end surfaces, said first and second end surfaces opposing to each other and said third and fourth end surfaces opposing to each other;
    a first end electrode formed on said substrate near said first end surface;
    a second end electrode formed on said substrate near said second end surface;
    an intermediate electrode formed on said substrate between said first and second end electrodes;
    a thick film type capacitor formed on said substrate between said first end electrode and said intermediate electrode;
    a thick film type resistance element formed on said substrate between said second end electrode and said intermediate electrode;
    a first terminal electrode portion provided on said first end surface to be electrically connected to said first end electrode;
    a second terminal electrode portion provided on said second end surface to be electrically connected to said second end electrode; and
    a third terminal electrode portion formed on said third end surface to be electrically connected to said intermediate electrode, wherein
    said thick film type capacitor includes a lower electrode film provided on said substrate and having one end integral with to said intermediate electrode, and
    an upper electrode film provided on said lower electrode film with a dielectric film interposed, having one end electrically connected to said first end electrode.

2. The composite device according to claim 1, further comprising a fourth terminal electrode portion provided on said fourth end surface and electrically connected to said intermediate electrode.

3. The composite device according to claim 1, wherein said thick film type resistance element includes a resistive film provided on said substrate having one end connected to said second end electrode and the other end connected electrically to said intermediate electrode.

4. The composite device according to claim 1, further comprising a cover coat provided on said substrate to cover said resistance element and said capacitor.

5. The composite device according to claim 1, wherein a direction from said first end surface to said second end surface is perpendicular to a direction from said third end surface to said fourth end surface.

6. The composite device according to claim 1, wherein said substrate is an insulating substrate.

7. The composite device according to claim 1, wherein said substrate is formed of a ceramic plate.

8. A method of manufacturing composite devices comprising the steps of:
    preparing a ceramic plate sectioned such that a plurality of substrates each including first, second, third and fourth end surfaces, said first and second end surfaces opposing to each other and said third and fourth end surfaces opposing to each other are provided, said ceramic plate having through holes each exposing part of said third and fourth end surfaces;
    forming a third terminal electrode portion at an inner surface of each of said through holes;
    forming a first end electrode near said first end surface, forming a second end electrode near said second end surface and forming an intermediate electrode electrically connected to said third terminal electrode portion between said first and second end electrodes, on said ceramic plate;
    forming a thick film type capacitor on said ceramic plate between said first end electrode and said intermediate electrode, said thick film type capacitor including a lower electrode wherein said lower electrode and said intermediate electrode are integral;

forming a thick film type resistance element on said ceramic plate between said second end electrode and said intermediate electrode;

cutting and dividing said ceramic plate such that said first and second end surfaces are exposed;

forming a first terminal electrode portion electrically connected to said first end electrode at said first end surface;

forming a second terminal electrode portion electrically connected to said second end electrode at said second end surface; and further dividing said ceramic plate such that said third and fourth end surfaces are exposed.

* * * * *